(12) United States Patent
Ahn et al.

(10) Patent No.: US 7,960,803 B2
(45) Date of Patent: *Jun. 14, 2011

(54) ELECTRONIC DEVICE HAVING A HAFNIUM NITRIDE AND HAFNIUM OXIDE FILM

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 152 days.

This patent is subject to a terminal disclaimer.

(21) Appl. No.: 12/359,748

(22) Filed: Jan. 26, 2009

(65) Prior Publication Data

US 2009/0134499 A1     May 28, 2009

Related U.S. Application Data

(63) Continuation of application No. 11/063,717, filed on Feb. 23, 2005, now Pat. No. 7,498,247.

(51) Int. Cl.
    *H01L 29/51*     (2006.01)
    *H01L 21/283*     (2006.01)

(52) U.S. Cl. ......... 257/411; 257/E29.165; 257/E21.159; 438/591; 438/287; 438/785

(58) Field of Classification Search .......... 438/216, 438/261, 287, 591, 763, 785; 257/288, 410, 257/411, E29.132, E29.165, E21.159
See application file for complete search history.

(56) References Cited

U.S. PATENT DOCUMENTS

| | | |
|---|---|---|
| 3,357,961 A | 12/1967 | Makowski et al. |
| 4,215,156 A | 7/1980 | Dalal et al. |
| 5,562,952 A | 10/1996 | Nakahigashi et al. |
| 5,572,052 A | 11/1996 | Kashihara et al. |
| 5,674,563 A | 10/1997 | Tarui et al. |

(Continued)

FOREIGN PATENT DOCUMENTS

EP     0540993 A1     5/1993

(Continued)

OTHER PUBLICATIONS

Aarik, Jaan, "Atomic layer growth of epitaxial $TiO_2$ thin films from $TiCl_4$ and $H_2O$ on alpha-$Al_2O_3$ substrates", *Journal of Crystal Growth*, 242(1-2), (2002), 189-198.

(Continued)

*Primary Examiner* — Mary Wilczewski
(74) *Attorney, Agent, or Firm* — Schwegman, Lundberg & Woessner, P.A.

(57) ABSTRACT

The use of atomic layer deposition (ALD) to form a dielectric layer of hafnium nitride ($Hf_3N_4$) and hafnium oxide ($HfO_2$) and a method of fabricating such a combination gate and dielectric layer produces a reliable structure for use in a variety of electronic devices. Forming the dielectric structure includes depositing hafnium oxide using precursor chemicals, followed by depositing hafnium nitride using precursor chemicals, and repeating to form the laminate structure. Alternatively, the hafnium nitride may be deposited first followed by the hafnium nitride. Such a dielectric layer may be used as the gate insulator of a MOSFET, a capacitor dielectric in a DRAM, or a tunnel gate insulator in flash memories, because the high dielectric constant (high-k) of the film provides the functionality of a thinner silicon dioxide film, and because of the reduced leakage current when compared to an electrically equivalent thickness of silicon dioxide.

25 Claims, 5 Drawing Sheets

U.S. PATENT DOCUMENTS

| | | |
|---|---|---|
| 5,698,022 A | 12/1997 | Glassman et al. |
| 5,745,334 A | 4/1998 | Hoffarth et al. |
| 5,751,021 A | 5/1998 | Teraguchi |
| 5,795,808 A | 8/1998 | Park |
| 5,827,571 A | 10/1998 | Lee et al. |
| 6,013,553 A | 1/2000 | Wallace et al. |
| 6,020,243 A | 2/2000 | Wallace et al. |
| 6,203,613 B1 | 3/2001 | Gates et al. |
| 6,225,168 B1 | 5/2001 | Gardner et al. |
| 6,297,539 B1 | 10/2001 | Ma et al. |
| 6,303,481 B2 | 10/2001 | Park |
| 6,348,386 B1 | 2/2002 | Gilmer |
| 6,420,279 B1 | 7/2002 | Ono et al. |
| 6,436,799 B1 | 8/2002 | Ramkumar et al. |
| 6,451,695 B2 | 9/2002 | Sneh |
| 6,452,229 B1 | 9/2002 | Krivokapic |
| 6,495,436 B2 | 12/2002 | Ahn et al. |
| 6,498,065 B1 | 12/2002 | Forbes et al. |
| 6,509,280 B2 | 1/2003 | Choi |
| 6,514,828 B2 | 2/2003 | Ahn et al. |
| 6,518,634 B1 | 2/2003 | Kaushik et al. |
| 6,534,420 B2 | 3/2003 | Ahn et al. |
| 6,541,079 B1 | 4/2003 | Bojarczuk, Jr. et al. |
| 6,551,929 B1 | 4/2003 | Kori et al. |
| 6,552,388 B2 | 4/2003 | Wilk et al. |
| 6,559,007 B1 | 5/2003 | Weimer |
| 6,559,014 B1 | 5/2003 | Jeon |
| 6,562,491 B1 | 5/2003 | Jeon |
| 6,590,252 B2 | 7/2003 | Kutsunai et al. |
| 6,592,942 B1 | 7/2003 | Van Wijck |
| 6,608,378 B2 | 8/2003 | Ahn et al. |
| 6,617,639 B1 | 9/2003 | Wang et al. |
| 6,632,279 B1 | 10/2003 | Ritala et al. |
| 6,638,859 B2 | 10/2003 | Sneh et al. |
| 6,652,924 B2 | 11/2003 | Sherman |
| 6,656,764 B1 | 12/2003 | Wang et al. |
| 6,661,058 B2 | 12/2003 | Ahn et al. |
| 6,674,138 B1 | 1/2004 | Halliyal et al. |
| 6,686,212 B1 | 2/2004 | Conley, Jr. et al. |
| 6,699,747 B2 | 3/2004 | Ruff et al. |
| 6,709,989 B2 | 3/2004 | Ramdani et al. |
| 6,737,309 B2 | 5/2004 | Matsuo |
| 6,750,126 B1 | 6/2004 | Visokay et al. |
| 6,756,298 B2 | 6/2004 | Ahn et al. |
| 6,767,795 B2 | 7/2004 | Ahn et al. |
| 6,770,536 B2 | 8/2004 | Wilk et al. |
| 6,777,353 B2 | 8/2004 | Putkonen |
| 6,780,704 B1 | 8/2004 | Raaijmakers et al. |
| 6,787,413 B2 | 9/2004 | Ahn |
| 6,790,791 B2 | 9/2004 | Ahn et al. |
| 6,794,315 B1 | 9/2004 | Klemperer et al. |
| 6,800,567 B2 | 10/2004 | Cho |
| 6,803,311 B2 | 10/2004 | Choi |
| 6,808,978 B2 | 10/2004 | Kim |
| 6,812,100 B2 | 11/2004 | Ahn et al. |
| 6,821,862 B2 | 11/2004 | Cho |
| 6,821,873 B2 | 11/2004 | Visokay et al. |
| 6,828,632 B2 | 12/2004 | Bhattacharyya |
| 6,831,315 B2 | 12/2004 | Raaijmakers et al. |
| 6,844,203 B2 | 1/2005 | Ahn et al. |
| 6,844,260 B2 | 1/2005 | Sarigiannis et al. |
| 6,888,739 B2 | 5/2005 | Forbes |
| 6,893,984 B2 | 5/2005 | Ahn et al. |
| 6,900,122 B2 | 5/2005 | Ahn et al. |
| 6,921,702 B2 | 7/2005 | Ahn et al. |
| 6,930,059 B2 | 8/2005 | Conley, Jr. et al. |
| 6,964,893 B2 | 11/2005 | Matsuo |
| 6,989,565 B1 | 1/2006 | Aronowitz et al. |
| 7,067,439 B2 | 6/2006 | Metzner et al. |
| 7,169,673 B2 | 1/2007 | Ahn et al. |
| 7,205,620 B2 | 4/2007 | Ahn et al. |
| 7,235,501 B2 | 6/2007 | Ahn et al. |
| 7,399,666 B2 | 7/2008 | Ahn et al. |
| 7,410,910 B2 | 8/2008 | Ahn et al. |
| 7,423,311 B2 | 9/2008 | Ahn et al. |
| 7,498,247 B2 | 3/2009 | Ahn et al. |
| 2001/0030352 A1 | 10/2001 | Ruf et al. |
| 2002/0037615 A1 | 3/2002 | Matsuo |
| 2002/0068466 A1 | 6/2002 | Lee et al. |
| 2002/0089023 A1 | 7/2002 | Yu et al. |
| 2002/0094632 A1 | 7/2002 | Agarwal et al. |
| 2002/0111001 A1 | 8/2002 | Ahn et al. |
| 2002/0146916 A1 | 10/2002 | Irino et al. |
| 2002/0155688 A1 | 10/2002 | Ahn |
| 2002/0155689 A1 | 10/2002 | Ahn |
| 2002/0172768 A1 | 11/2002 | Endo et al. |
| 2002/0177293 A1 | 11/2002 | Wilk et al. |
| 2002/0192975 A1 | 12/2002 | Ahn |
| 2002/0192979 A1 | 12/2002 | Ahn |
| 2003/0003702 A1 | 1/2003 | Ahn |
| 2003/0017717 A1 | 1/2003 | Ahn |
| 2003/0043637 A1 | 3/2003 | Forbes et al. |
| 2003/0045060 A1 | 3/2003 | Ahn et al. |
| 2003/0045078 A1 | 3/2003 | Ahn et al. |
| 2003/0048666 A1 | 3/2003 | Eldridge et al. |
| 2003/0049942 A1 | 3/2003 | Haukka et al. |
| 2003/0059535 A1 | 3/2003 | Luo et al. |
| 2003/0104666 A1 | 6/2003 | Bojarczuk, Jr. et al. |
| 2003/0116804 A1 | 6/2003 | Visokay et al. |
| 2003/0119246 A1 | 6/2003 | Ahn |
| 2003/0119291 A1 | 6/2003 | Ahn et al. |
| 2003/0132491 A1 | 7/2003 | Ahn |
| 2003/0176049 A1 | 9/2003 | Hegde et al. |
| 2003/0185980 A1 | 10/2003 | Endo |
| 2003/0207032 A1 | 11/2003 | Ahn et al. |
| 2003/0207540 A1 | 11/2003 | Ahn et al. |
| 2003/0227033 A1 | 12/2003 | Ahn et al. |
| 2003/0232501 A1 | 12/2003 | Kher et al. |
| 2003/0232511 A1 | 12/2003 | Metzner et al. |
| 2003/0235961 A1 | 12/2003 | Metzner et al. |
| 2004/0007171 A1 | 1/2004 | Ritala et al. |
| 2004/0009679 A1 | 1/2004 | Yeo et al. |
| 2004/0012043 A1 | 1/2004 | Gealy et al. |
| 2004/0023461 A1 | 2/2004 | Ahn et al. |
| 2004/0028811 A1 | 2/2004 | Cho et al. |
| 2004/0033661 A1 | 2/2004 | Yeo et al. |
| 2004/0038554 A1 | 2/2004 | Ahn |
| 2004/0043541 A1 | 3/2004 | Ahn et al. |
| 2004/0043569 A1 | 3/2004 | Ahn et al. |
| 2004/0043635 A1 | 3/2004 | Vaartstra |
| 2004/0110348 A1 | 6/2004 | Ahn et al. |
| 2004/0110391 A1 | 6/2004 | Ahn et al. |
| 2004/0135186 A1 | 7/2004 | Yamamoto |
| 2004/0144980 A1 | 7/2004 | Ahn et al. |
| 2004/0164357 A1 | 8/2004 | Ahn et al. |
| 2004/0168627 A1 | 9/2004 | Conley, Jr. et al. |
| 2004/0171280 A1 | 9/2004 | Conley, Jr. et al. |
| 2004/0175882 A1 | 9/2004 | Ahn et al. |
| 2004/0183108 A1 | 9/2004 | Ahn |
| 2004/0183143 A1 | 9/2004 | Matsuo |
| 2004/0185654 A1 | 9/2004 | Ahn |
| 2004/0203254 A1 | 10/2004 | Conley, Jr. et al. |
| 2004/0214399 A1 | 10/2004 | Ahn et al. |
| 2004/0222476 A1 | 11/2004 | Ahn et al. |
| 2004/0235313 A1 | 11/2004 | Frank et al. |
| 2004/0262700 A1 | 12/2004 | Ahn et al. |
| 2004/0266217 A1 | 12/2004 | Kim et al. |
| 2005/0009370 A1 | 1/2005 | Ahn |
| 2005/0020017 A1 | 1/2005 | Ahn et al. |
| 2005/0023578 A1 | 2/2005 | Bhattacharyya |
| 2005/0023594 A1 | 2/2005 | Ahn et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0026349 A1 | 2/2005 | Forbes et al. |
| 2005/0026458 A1 | 2/2005 | Basceri et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0032292 A1 | 2/2005 | Ahn et al. |
| 2005/0037563 A1 | 2/2005 | Ahn |
| 2005/0051828 A1 | 3/2005 | Park et al. |
| 2005/0054165 A1 | 3/2005 | Ahn et al. |
| 2005/0077519 A1 | 4/2005 | Ahn et al. |
| 2005/0205947 A1 | 9/2005 | Yu et al. |
| 2005/0227442 A1 | 10/2005 | Ahn et al. |

| | | | |
|---|---|---|---|
| 2005/0275033 A1 | 12/2005 | Zhu et al. |
| 2005/0277256 A1 | 12/2005 | Ahn et al. |
| 2006/0001151 A1 | 1/2006 | Ahn et al. |
| 2006/0022283 A1 | 2/2006 | Thomas et al. |
| 2006/0054943 A1 | 3/2006 | Li et al. |
| 2006/0183272 A1 | 8/2006 | Ahn et al. |
| 2006/0189164 A1 | 8/2006 | Okabe et al. |
| 2006/0208215 A1 | 9/2006 | Metzner et al. |
| 2006/0246741 A1 | 11/2006 | Ahn et al. |
| 2006/0252211 A1 | 11/2006 | Ahn et al. |
| 2006/0263972 A1 | 11/2006 | Ahn et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0020835 A1 | 1/2007 | Ahn et al. |
| 2007/0037415 A1 | 2/2007 | Ahn et al. |
| 2007/0045752 A1 | 3/2007 | Forbes et al. |
| 2007/0134931 A1 | 6/2007 | Ahn et al. |

FOREIGN PATENT DOCUMENTS

| | | |
|---|---|---|
| EP | 1096042 | 5/2001 |
| KR | 2004037568 | 5/2004 |
| WO | WO-02/31875 | 4/2002 |
| WO | WO-2004079796 A3 | 9/2004 |

OTHER PUBLICATIONS

Aarik, Jaan, "Phase transformations in hafnium dioxide thin films grown by atomic layer deposition at high temperatures", *Applied Surface Science*, 173(1-2), (Mar. 2001), 15-21.

Aarik, Jaan, "Texture development in nanocrystalline hafnium dioxide thin films grown by atomic layer deposition", *Journal of Crystal Growth*, 220(1-2), (Nov. 15, 2000), 105-113.

Becker, Jill S., "Atomic Layer Deposition of Insulating Hafnium and Zirconium Nitrides", *Chem. Mater.* 16, (2004), 3497-3501.

Bradley, D. C., "Metallo-organic Compounds Containing Metal-Nitrogen Bonds", *J. Chem Soc.* (A), (1969), 980-984.

Bradley, D. C., "Metallo-organic Compounds containing metal-Nitrogen bonds", *J. Chem. Soc.*, (1960), 3857-3861.

Chin, A., et al., "High Quality $La_2O_3$ and $Al_2O_3$ Gate Dielectrics with Equivalent Oxide Thickness 5-10Å", *Digest of Technical Papers. 2000 Symposium on VLSI Technology, 2000*, Honolulu, (Jun. 13-15, 2000), 16-17.

Copel, M., et al., "Formation of a stratified lanthanum silicate dielectric by reaction with Si(001)", *Applied Physics Letters*, 78(11), (Mar. 12, 2001), 1607-1609.

Dimoulas, A., et al., "Structural and electrical quality of the high-k dielectric $Y_2O_3$ on Si (001): Dependence on growth parameters", *Journal of Applied Physics*, 92(1), (Jul. 1, 2002), 426-431.

Forsgren, Katarina, "Atomic Layer Deposition of $HfO_2$ using hafnium iodide", *Conference held in* Monterey, California, (May 2001), 1 page.

Guha, S, et al., "Atomic beam deposition of lanthanum-and yttrium-based oxide thin films for gate dielectrics", *Applied Physics Letters*, 77, (2000), 2710-2712.

Guha, S., et al., "High temperature stability of $Al_2O_3$ dielectrics on Si: Interfacial metal diffusion and mobility degradation", *Applied Physics Letters*, vol. 81, No. 16, (Oct. 14, 2002), 2956-2958.

Gusev, E P, "Ultrathin High-K Dielectrics Grown by Atomic Layer Deposition: A Comparative Study of $ZrO_2$, $HfO_2$, $Y_2O_3$ and $Al_2O_3$", *Electrochemical Society Proceedings* vol. 2001-9, (2001), 189-195.

Hoshino, Y., "Characterization and Control of the $HfO_2Si_{(001)}$ Interfaces", *Applied Physics Letters*, 81, (Sep. 30, 2002), 2650-2652.

Huang, C. H., et al., "$La_2O_3Si_{0.3}Ge_{0.7}$ p-MOSFETs with high hole mobility and good device characteristics", *IEEE Electron Device Letters*, 23(12), (Dec. 2002), 710-712.

Iwai, H., et al., "Advanced gate dielectric materials for sub-100 nm CMOS", *International Electron Devices Meeting, 2002. IEDM '02. Digest.*, (Dec. 8-11, 2002), 625-628.

Iwamoto, K., "Advanced Layer-By-Layer Deposition and Annealing Process for High-Quality High-K Dielectrics Formation", *Electrochemical Society Proceedings* vol. 2003 (14), (2003), 265-272.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001), 471-474.

Ko, Myoung-Gyun, et al., "High density plasma enhanced atomic layer deposition of lanthanum oxide for high-k gate oxide material", *207th Meeting of the Electrochemical Society*, (May 2005), 1 page.

Kukli, Kaupo, "Properties of $HfO_2$ Thin Films Grown by ALD from Hafnium tetrakis(ethylmethylamide) and Water", *Journal of the Electrochemical Society*, 151 (8), (2004), F189-F193.

Kwo, J., et al., "High E gate dielectrics $Gd_2O_3$ and $Y_2O_3$ for silicon", *Applied Physics Letters*, 77(1), (Jul. 3, 2000), 130-132.

Leskela, M., "ALD precursor chemistry: Evolution and future challenges", *J. Phys. IV France*, 9, (1999), 837-852.

Lu, Xu-Bing, et al., "Structure and dielectric properties of amorphous $LaAlO_3$ and $LaAlO_xN_y$ films as alternative gate dielectric materials", *Journal of Applied Physics*, 94(2), (Jul. 15, 2003), 1229-1234.

Maria, J. P., et al., "High temperature stability in lanthanum and zirconia-based gate dielectrics", *Journal of Applied Physics*, 90(7), (Oct. 1, 2001), 3476-3482.

Michaelson, Herbert B., "The work function of the elements and its periodicity", *Journal of Applied Physics*, 48(11), (Nov. 1977), 4729-4733.

Nakajima, et al., "Atomic-layer-deposited silicon-nitride/$SiO_2$ highly stacked gate dielectrics for highly reliable p-metal-oxide-semiconductor filed-effect transistors", *Applied Physics Letters*, vol. 77, (Oct. 2000), 2855-2857.

Ritala, M., "Atomic layer deposition of oxide thin films with metal alkoxides as oxygen sources", *Science*, 288(5464), (Apr. 14, 2000), 319-321.

Shimizu, Takashi, et al., "Electrical Properties of Ruthenium/Metalorganic Chemical Vapor Deposited La-Oxide/Si Field Effect Transistors", *Jpn. J. Appl. Phys.*, vol. 42, Part 2, No. 11A, (2003), L1315-L1317.

Sneh, Ofer, "Thin film atomic layer deposition equipment for semiconductor processing", *Thin Solid Films*, 402(1-2), (2002), 248-261.

Sneh, Ofer, "Thin film atomic layer deposition equipment for semiconductor processing", *Thin Solid Films*, 402, (2002), 248-261.

Suntola, T., "Atomic Layer Epitaxy", *Handbook of Crystal Growth, 3; Thin Films of Epitaxy, Part B: Growth Mechanics and Dynamics*, Amsterdam, (1994), 601-663.

Suntola, Tuomo, "Atomic layer epitaxy", *Thin Solid Films*, 216(1), (Aug. 28, 1992), 84-89.

Tewg, J.Y., "Electrical and Physical Characterization of Zirconium-Doped Tantalum Oxide Films", *Electrochemical Society Proceedings*, vol. 2002-28, (2002), 75-81.

Wilk, G. D., "High-K gate dielectrics: Current status and materials properties considerations", *Journal of Applied Physics*, 89(10), (May 2001), 5243-5275.

Yamada, Hirotoshi, et al., "MOCVD of High-Dielectric-Constant Lanthanum Oxide Thin Films", *Journal of the Electrochemical Society*, 150(8), (Aug. 2003), G429-G435.

Yamamoto, K., "Effect of Hf metal predeposition on the properties of sputtered $HfO_2$/Hf stacked gate dielectrics", *Applied Physics Letters*, 81, (Sep. 9, 2002), 2053-2055.

Zhang, H, et al., "High permitivity thin film nanolaminates", *Journal of Applied Physics*, 87(4), (Feb. 2000), 1921-1924.

Zhong, Huicai, et al., "Electrical Properties of Ru and $RuO_2$ Gate Electrodes for Si-PMOSFET with $ZrO2$ and Zr-Silicate Dielectrics", *Journal of Electronic Materials*, 30(12), (Dec. 2001), 1493-1498.

ELECTRONIC DEVICE HAVING A HAFNIUM NITRIDE AND HAFNIUM OXIDE FILM

CROSS REFERENCE TO RELATED APPLICATIONS

The present application is a Continuation of application Ser. No. 11/063,717, filed Feb. 23, 2005, now U.S. Pat. No. 7,498,247, which is incorporated herein by reference in its entirety.

TECHNICAL FIELD

This application relates generally to semiconductor devices and device fabrication and, more particularly, to dielectric layers and their method of fabrication.

BACKGROUND

The semiconductor industry has a market driven need to reduce the size of devices such as transistors, and to thus increase the operational speed of the device as well as reduce the device power consumption. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of less than 100 nm. This scaling of gate dielectric thickness may be the most difficult issue facing the production of the next generation of MOSFETs. These increasingly smaller, faster, lower power consumption and more reliable integrated circuits (ICs) will likely be used in manufacturing products such as processor chips, mobile telephones, and memory devices such as dynamic random access memories (DRAMs).

Currently, the semiconductor industry reduces (or scales down) all of the dimensions of its basic devices, such as the silicon based MOSFET, to achieve the required improved operation. As mentioned, this device scaling includes scaling the gate dielectric, which has primarily been formed of silicon dioxide ($SiO_2$). A thermally grown amorphous $SiO_2$ layer provides a good electrically and thermodynamically stable material, where the interface of the $SiO_2$ layer with underlying silicon provides a high quality interface as well as superior electrical isolation properties. However, continued scaling in microelectronic devices has created problems as the gate dielectric has become thinner, such as increased leakage currents passing through the gate dielectric. Thus there is a need to develop other dielectric materials for use as gate dielectrics, in particular dielectric materials with higher dielectric constants (k) than the relatively low k value of silicon dioxide.

SUMMARY

The above mentioned problems are addressed by the present invention and will be understood by reading and studying the following specification. An embodiment for a method for forming an electronic device includes forming a dielectric layer by using atomic layer deposition (ALD) technique to form a dielectric having hafnium nitride, $Hf_3N_4$, and hafnium oxide, $HfO_2$. An embodiment includes forming an integrated circuit having a dielectric made by using an atomic layer deposition to form hafnium nitride layers and hafnium oxide layers, and having a conductive layer on the dielectric. Either the hafnium nitride or the hafnium oxide may be deposited first, and there may be single layers of each, or multiple layers of either or both materials. Another embodiment includes a method of forming a memory array having an atomic layer deposited dielectric formed of hafnium nitride and hafnium oxide, contacting a conductive layer and forming an address decoder coupled to the memory array.

Embodiments include structures for capacitors, transistors, memory devices, and electronic systems with dielectric layers containing an atomic layer deposited hafnium nitride and hafnium oxide dielectric, and methods for forming such structures. These and other aspects, embodiments, advantages, and features will become apparent from the following description and the referenced drawings.

DETAILED DESCRIPTION

Figure 1:
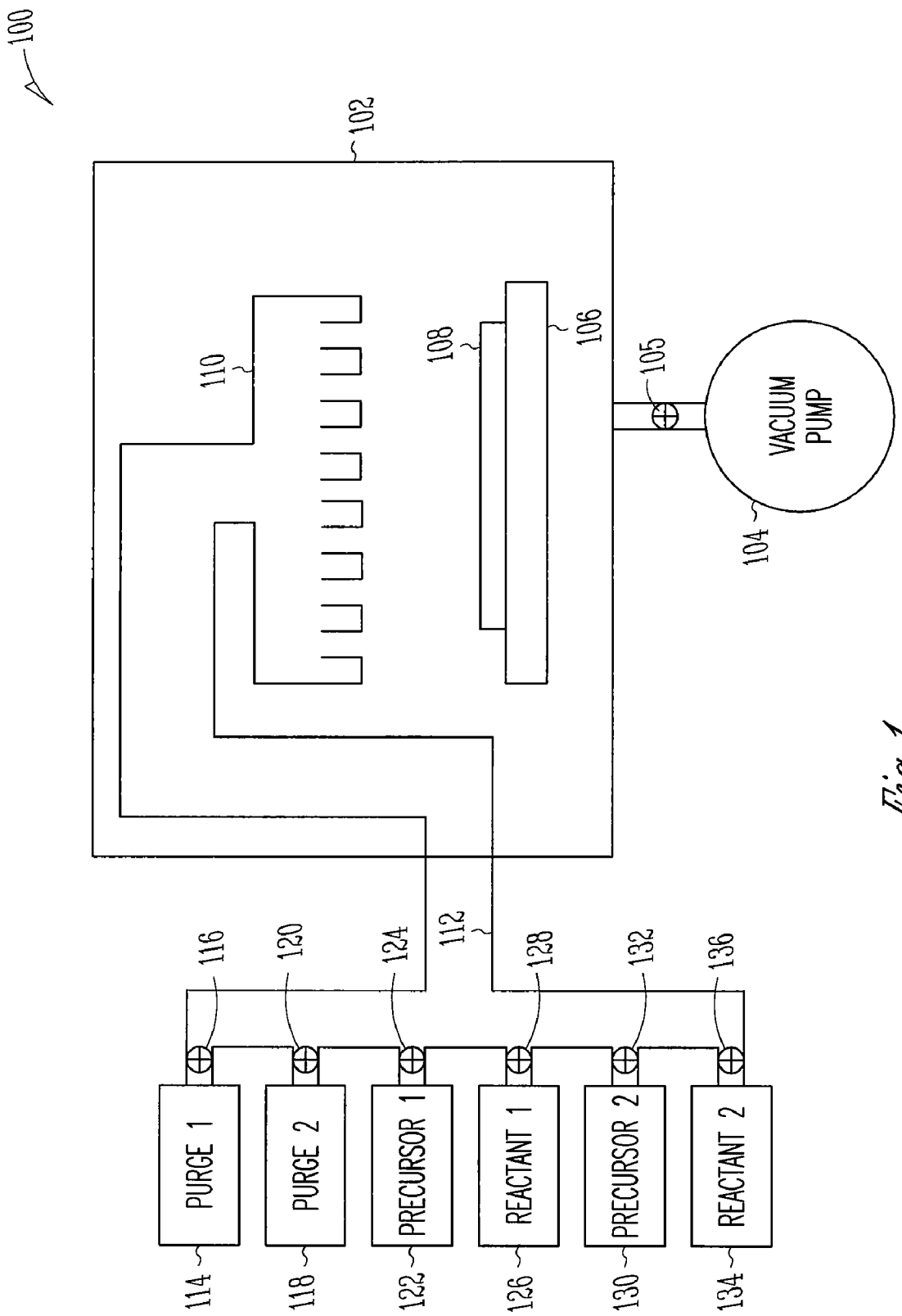
FIG. 1 depicts an atomic layer deposition system for fabricating a dielectric layer formed as a nanolaminate layered sequence of hafnium nitride and hafnium oxide, according to various embodiments.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The scaling of the metal oxide semiconductor field effect transistor (MOSFET) to submicron feature sizes in order to increase operational speed, decrease power consumption and increase reliability, requires a corresponding reduction in the gate dielectric thickness. Although thermally grown amorphous silicon dioxide $SiO_2$ is currently the dielectric most often used in these applications, the thinner layers of silicon dioxide are developing reliability and performance issues. As the silicon dioxide thickness is reduced to about 2.5 nm, a large gate leakage current of up to one amp per square centimeter flows through the dielectric due to direct tunneling. Such a problem may occur in any dielectric material as the material thickness approaches tunneling thickness. To achieve the necessary large capacitance per unit area across the gate dielectric to control the electrical properties of the semiconductor material below the gate dielectric without using dielectric layers that are so thin as to potentially have large leakage currents, it is necessary to use thicker layers of dielectric materials having higher dielectric constant (k) values than silicon dioxide or silicon nitride. An additional advantage of some high-k materials is the improved diffusion barrier preventing gate electrode dopants, such as boron and phosphorous, from entering the semiconductor below the gate dielectric.

Hafnium is elemental metal number 72, and is situated on the periodic table of elements next to tantalum and right after the lanthanide metals. Hafnium is commonly used to control nuclear reactions and to scavenge gases in vacuum systems. Hafnium oxide has a formula of $HfO_2$, a dielectric constant k of about 17, and a dielectric leakage rate of about $10^{-8}$ $A/cm^2$ at a 1 MV/cm electric field strength. Hafnium oxide layers can be atomic layer deposited (ALD) using various precursors such as hafnium tetraiodide and oxygen at a temperature of between 400 to 700° C., or hafnium tetrachloride and steam at 300° C., or anhydrous hafnium nitrate ($Hf(NO_3)_4$) and ozone at 160° C. In an embodiment, the hafnium oxide may be grown by ALD of a hafnium-containing precursor having a formula of $Hf[N(CH_3)(C_2H_5)]_4$, which may be known as a homoleptic tetrakis(dialkylamino) metal(IV) compound, and water vapor at a deposition temperature of from 200° C. to 300° C. Dielectric constant values and dielectric leakage current values do not vary significantly over the 200 to 300° C. deposition temperature range. Other known types of tetrakis(dialkylamino) metal compounds may also be used, such as tetrakis dimethlyamine, $Hf[N(CH_3)_2]_4$, or tetrakis diethlyamine, $Hf[N(C_2H_5)_2]_4$.

Hafnium nitride has a formula of $Hf_3N_4$, and a dielectric constant k of about 30. Hafnium nitride films can be atomic layer deposited using various precursors such as the homoleptic tetrakis(dialkylamino) metal (IV) compounds discussed above, and ammonia, $NH_3$, at 150 to 250° C. deposition temperature. In consideration of the two materials' temperature ranges, an embodiment has the deposition temperature between 200 to 250° C. The preparation of the above mentioned tetrakis(dialkylamino) metal compounds may be synthesized from hafnium chloride and the various amine salts as is known in the chemical art.

Each of the hafnium oxide and hafnium nitride films may have a very tightly controlled thickness for each deposition cycle that depends on the saturation of the substrate surface. For example, hafnium oxide layers may typically be 0.14 nm thick per deposition cycle. If repetitive layers of hafnium oxide are grown upon one another, then the single resulting film of hafnium oxide will have a thickness that is easily controlled by simply controlling the number of deposition cycles run. The surface of the ALD layer formed is also very smooth and continuous, even over sharp underlying topography. One of the useful properties of ALD in forming dielectric layers is the high level of what is known as "step coverage", even over sharp edges and in trenches having aspect ratios of depth to width of 40 to 1. In an embodiment, the hafnium oxide layer has 100% step coverage over 90 degree angle steps.

The deposition cycles may also be alternated between the two different dielectrics, and the resulting film may either be a nanolaminate of the two or more different dielectrics, or the two or more dielectrics may form an alloy with each other if the similarity between the two or more dielectrics results in miscible materials. In either case the film properties may vary depending upon the ratio of the two or more different materials, and thus materials may be formed that have engineered properties. In an embodiment, to form a dielectric layer having an overall dielectric constant k value of about 24, deposit one layer of hafnium oxide and then one layer of hafnium nitride, and repeat until the desired overall dielectric thickness is achieved. In this way a material having k of 17, such as hafnium oxide, may be combined with a material having k of 30, such as hafnium nitride, to form a dielectric layer having the desired dielectric constant k of 24.

A composite dielectric layer of hafnium nitride and hafnium oxide may be beneficially used because the relatively high dielectric constant (high-k) of from 17 to 30 of the film (depending upon the ratio of hafnium oxide to hafnium nitride) as compared to 3.9 for silicon dioxide, and the excellent current leakage value of hafnium oxide, provides the functionality of a much thinner silicon dioxide film without the reliability loss and leakage currents consequent to using such physically thin films.

It is possible to use thicker layers of hafnium oxide and hafnium nitride to replace much thinner silicon dioxide layers without changing the electrical properties of the transistor because of the higher dielectric constant of the hafnium dielectrics. A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would need to be approximately 4 to 7 Å.

Additional requirements on a SiO$_2$ layer would depend on the gate electrode used in conjunction with the SiO$_2$ gate dielectric. Using a conventional polysilicon gate would result in an additional increase in t$_{eq}$ for the SiO$_2$ layer. This additional thickness could be eliminated by using a metal gate electrode, though metal gates are not currently used in typical complementary metal-oxide-semiconductor field effect transistor (CMOS) technology. Thus, future devices would be designed towards a physical SiO$_2$ gate dielectric layer of about 5 Å or less.

Silicon dioxide is used as a gate dielectric, in part, due to its electrical isolation properties in a SiO$_2$—Si based structure. This electrical isolation is due to the relatively large band gap of SiO$_2$ (8.9 eV), which makes it a good insulator. Significant reductions in its band gap would eliminate it as a material for use as a gate dielectric. However, as the thickness of a SiO$_2$ layer decreases, the number of atomic layers, or monolayers of the material in the thickness decreases. At a certain thickness, the number of monolayers will be sufficiently small that the SiO$_2$ layer will not have a complete arrangement of atoms as in a thicker or bulk layer. As a result of incomplete formation relative to a bulk structure, a thin SiO$_2$ layer of only one or two monolayers will not form a full band gap. The lack of a full band gap in a SiO$_2$ gate dielectric may cause an effective short between an underlying conductive silicon channel and an overlying polysilicon gate. This undesirable property sets a limit on the physical thickness to which a SiO$_2$ layer can be scaled. The minimum thickness due to this monolayer effect is thought to be about 7-8 Å. Therefore, for future devices to have a t$_{eq}$ less than about 10 Å, other dielectrics than SiO$_2$ need to be considered for use as a gate dielectric.

For a typical dielectric layer used as a gate dielectric, the capacitance is determined as one for a parallel plate capacitance: C=k∈$_0$A/t, where k is the dielectric constant, ∈$_0$ is the permittivity of free space, A is the area of the capacitor, and t is the thickness of the dielectric. The thickness, t, of a material is related to its t$_{eq}$ for a given capacitance, with SiO$_2$ having a dielectric constant k$_{ox}$=3.9, as $$t=(k/k_{ox})t_{eq}=(k/3.9)\, t_{eq}.$$

Thus, materials with a dielectric constant greater than that of SiO$_2$ will have a physical thickness that can be considerably larger than a desired t$_{eq}$, while providing the desired equivalent oxide thickness. For example, an alternate dielectric material with a dielectric constant of 10 could have a thickness of about 25.6 Å to provide a t$_{eq}$ of 10 Å, not including any depletion/inversion layer effects. Thus, a reduced equivalent oxide thickness for transistors can be realized by using dielectric materials with higher dielectric constants than SiO$_2$.

The thinner equivalent oxide thickness required for lower transistor operating voltages and smaller transistor dimensions may be realized by a significant number of materials, but additional fabricating requirements makes determining a suitable replacement for SiO$_2$ difficult. The current view for the future of the microelectronics industry still predicts silicon-based devices. This requires that the gate dielectric employed be grown on a silicon substrate or silicon layer, which places significant constraints on the substitute dielectric material. During the formation of the dielectric on the silicon layer, there exists the possibility that a small layer of SiO$_2$ could be formed in addition to the desired dielectric. The result would effectively be a dielectric layer consisting of two sub-layers in parallel with each other and the silicon layer on which the dielectric is formed. In such a case, the resulting capacitance would be that of two dielectrics in series. As a result, the t$_{eq}$ of the dielectric layer would be the sum of the SiO$_2$ thickness and a multiplicative factor of the thickness, t, of the dielectric being formed, written as $$t_{eq}=t_{SiO2}+(k_{ox}/k)t.$$

Thus, if a SiO$_2$ layer is formed in the process, the t$_{eq}$ is again limited by a SiO$_2$ layer. In the event that a barrier layer is formed between the silicon layer and the desired dielectric in which the barrier layer prevents the formation of a SiO$_2$ layer, the t$_{eq}$ would be limited by the layer with the lowest dielectric constant. However, whether a single dielectric layer with a high dielectric constant or a barrier layer with a higher dielectric constant than SiO$_2$ is employed, the layer directly in contact, or interfacing with the silicon layer must provide a high quality interface to maintain high channel carrier mobility.

One of the advantages of using SiO$_2$ as a gate dielectric has been that the formation of the SiO$_2$ layer results in an amorphous gate dielectric. Having an amorphous structure for a gate dielectric provides reduced leakage current problems associated with grain boundaries in polycrystalline gate dielectrics, which may cause high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to SiO$_2$ also have the disadvantage of a crystalline form, at least in a bulk configuration. The best candidates for replacing SiO$_2$ as a gate dielectric are those with high dielectric constants, and which can be fabricated as a thin layer with an amorphous form.

Candidates to replace SiO$_2$ include high-k dielectric materials. High-k materials include materials having a dielectric constant greater than silicon dioxide, for example, dielectric materials having a dielectric constant greater than about twice the dielectric constant of silicon dioxide. An appropriate high-k gate dielectric should have a large energy gap (E$_g$) and large energy barrier heights with the silicon substrate for both electrons and holes. Generally, the band gap is inversely related to the dielectric constant for a high-k material, which lessens some advantages of the high-k material. A set of high-k dielectric candidates for replacing silicon oxide as the dielectric material in electronic components in integrated circuit includes the lanthanide oxides such as Pr$_2$O$_3$, La$_2$O$_3$, Nd$_2$O$_3$, Sm$_2$O$_3$, Gd$_2$O$_3$, Dy$_2$O$_3$, Ce$_2$O$_3$, Tb$_2$O$_3$, Er$_2$O$_3$, Eu$_2$O$_3$, Lu$_2$O$_3$, Tm$_2$O$_3$, Ho$_2$O$_3$, Pm$_2$O$_3$, and Yb$_2$O$_3$. Other candidates include various lanthanide silicates, zirconium oxide ZrO$_2$, and hafnium oxide HfO$_2$. Such high dielectric constant layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current, in particular the leakage current caused by tunneling mechanisms.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer.

During a conventional sputtering deposition process, particles of the material to be deposited bombard the surface at a high energy. When a particle hits the surface, some particles adhere, and other particles cause damage. High energy impacts remove body region particles, creating pits. The surface of such a deposited layer may have a rough contour due to the rough interface at the body region.

In an embodiment, a dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited dielectric film may have an engineered transition with a substrate surface, or may be formed with many thin layers of different dielectric materials to enable selection of the dielectric constant to a value between that available from pure dielectric compounds.

ALD, which may be known as atomic layer epitaxy (ALE), is a modification of chemical vapor deposition (CVD) and may also be called "alternately pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In the first reaction step of the ALD process the first precursor saturates and is chemisorbed at the substrate surface, during the first pulsing phase. Subsequent pulsing with a purging gas removes excess precursor from the reaction chamber, specifically the precursor that has not been chemisorbed.

The second pulsing phase introduces a second precursor to the substrate where the growth reaction of the desired film takes place, with a reaction thickness that depends upon the amount of the chemisorbed first precursor. Subsequent to the film growth reaction, reaction byproducts and precursor excess are purged from the reaction chamber. With a precursor chemistry where the precursors adsorb and aggressively react with each other on the substrate, one ALD cycle can be performed in less than one second in properly designed flow type reaction chambers. Typically, precursor pulse times range from about 0.5 sec to about 2 to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films, and multilayer structures of these. There has also been considerable interest in the ALD growth of silicon and germanium films, but due to the difficult precursor chemistry, this has not been very successful.

The precursors used in an ALD process may be gaseous, liquid or solid. However, liquid or solid precursors should be volatile with high vapor pressures or low sublimation temperatures. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors may be used, though evaporation rates may vary somewhat during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on, or react with the surface, though the interaction between the precursor and the surface as well as the mechanism for the adsorption is different for different precursors. The molecules at the substrate surface should react aggressively with the second precursor, which may be called a reactant, to form the desired solid film. Additionally, precursors should not react with the film to cause etching, and precursors should not dissolve in the film. The use of highly reactive precursors in ALD may contrast with the precursors for conventional metallo-organic CVD (MOCVD) type reactions.

The by-products in the reaction should be gaseous in order to allow their easy removal from the reaction chamber during a purge stage. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an ALD process, molecular precursors are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of ALD processes, films can be layered in equal metered sequences that are all identical in chemical kinetics, deposition per cycle, composition, and thickness. ALD sequences generally deposit less than a full layer of the deposited material (for example hafnium oxide) per deposition cycle. Typically, a deposition or growth rate of about 0.25 to about 2.00 Å per ALD cycle can be realized.

The advantages of ALD include continuity at an interface, avoiding poorly defined nucleating regions that are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. ALD processes allow for deposition control on the order of single monolayers and the ability to deposit monolayers of amorphous films.

A cycle of an ALD deposition sequence includes pulsing a precursor material, pulsing a purging gas for the precursor, pulsing a reactant precursor, and pulsing the reactant's purging gas, resulting in a very consistent deposition thickness that depends upon the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the fourth reactant's purging gas. In the case where the thickness of the first series of cycles results in a dielectric layer that is only a few molecular layers thick, and the second series of cycles also results in a different dielectric layer that is only a few molecular layers thick, this may be known as a nanolayer material or a nanolaminate. A nanolaminate means a composite film of ultra thin layers of two or more different materials in a layered stack, where the layers are alternating layers of the different materials having a thickness on the order of a nanometer, and may be a continuous film only a single monolayer thick of the material. The nanolayers are not limited to alternating single layers of each material, but may include having several layers of one material alternating with a single layer of the other material, to obtain a desired ratio of the two or more materials. Such an arrangement may obtain a dielectric constant that is between the values of the two or more materials singly. A nanolaminate may also include several layers of one material formed by an ALD reaction either over or under a single layer of a different material formed by another type of reaction, such as a MOCVD reaction. The layers of different materials may remain separate after deposition, or they may react with each other to form an alloy layer.

In an embodiment, a nanolaminate layer of hafnium oxide is formed on a substrate mounted in a reaction chamber using ALD. Alternatively, multiple layers may be formed in a repetitive sequence using precursor gases individually pulsed into the reaction chamber. An embodiment includes forming the hafnium oxide layers using a precursor gas such as hafnium tetrakisdimethylamine, having a chemical formula of $Hf[N(CH_4)_2]_4$, and a reactant of water vapor. An embodiment includes forming the hafnium nitride layers using a hafnium tetrakisdimethylamine as above, and a reactant of ammonia. Other solid or liquid precursors may be used in an appropriately designed reaction chamber. The use of such precursors in an ALD reaction chamber may result in lower deposition temperatures in the range of 150 to 300° C., and the ability to use mildly oxidizing reactant materials such as $H_2O$, $H_2O_2$, various alcohols, $N_2O$, $NH_3$, ozone or oxygen. Purge gases may include nitrogen, helium, argon or neon. Such films may survive high temperature anneals (sometimes used to reduce fixed surface state charges and improve metal to semiconductor resistance) of up to 1000° C., and have low leakage currents of less than $5\times10^{-8}$ $A/cm^2$ at electric field strengths of one MVolt/cm.

FIG. 1 shows an embodiment of an atomic layer deposition system 100 for forming a dielectric film containing hafnium nitride and hafnium oxide. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the substrate 108 in a uniform fashion. The gases introduced by the gas distribution fixture, sometimes referred to as a showerhead, react with the substrate 108, and any excess gas and reaction products are removed from chamber 102 by vacuum pump 104 through a control valve 105. Each gas originates from individual gas sources 114, 118, 122, 126, 130, and 134, with a flow rate and time controlled by mass-flow controllers 116, 120, 124, 128, 132 and 136, respectively. Gas sources 122 and 130 provide a precursor gas either by storing the precursor as a gas or by providing for evaporating a solid or liquid material to form the selected precursor gas.

Also included in the system are purging gas sources 114 and 118, coupled to mass-flow controllers 116 and 120, respectively. The embodiment may use only one of the purge gases for all four disclosed illustrative purging steps, or both purge gases may be used simultaneously, or alternately, as required for the particular desired result. Furthermore, additional purging gas sources can be constructed in ALD system 100, one purging gas source for each different precursor and reactant gas, for example. For a process that uses the same purging gas for multiple precursor gases, fewer purging gas sources may be required for ALD system 100. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for depositing $HfO_2$ and $Hf_3N_4$ films, other commercially available ALD systems may also be used.

The use, construction and operation of reaction chambers for deposition of films are understood by those of ordinary skill in the art of semiconductor fabrication. A variety of such commercially available reaction chambers may be used. Furthermore, one of ordinary skill in the art will comprehend the necessary detection, measurement, and control techniques in the art of semiconductor fabrication upon reading and understanding the disclosure.

The elements of ALD system 100 may be controlled by a computer. To focus on the use of ALD system 100, the computer is not shown. Those skilled in the art can appreciate that the individual elements such as pressure control, temperature control, and gas flow within ALD system 100 can be under computer control.

Figure 2:
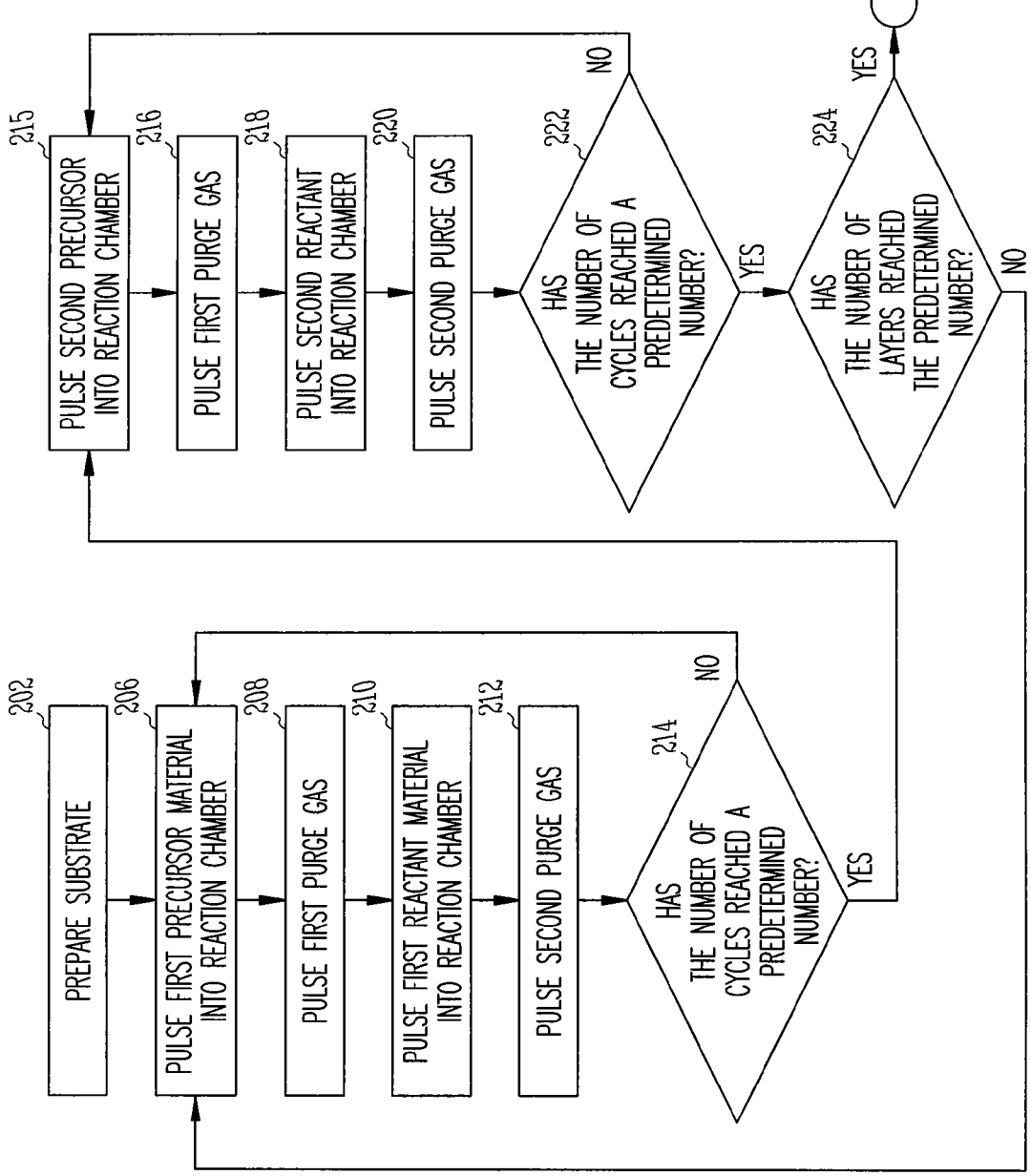
FIG. 2 illustrates a flow diagram of elements for an embodiment of a method to form a dielectric layer containing hafnium nitride and hafnium oxide by atomic layer deposition according to various embodiments.

FIG. 2 illustrates a flow diagram of operational steps for an embodiment of a method to form a nanolaminate dielectric layer containing hafnium nitride layers alternating with hafnium oxide layers in various ways, such as nine layers of hafnium oxide and nine layers of hafnium nitride, which pattern may be repeated until a film of a desired thickness is formed. At 202, a substrate is prepared to react immediately with, and chemisorb the first precursor gas. This preparation will remove contaminants such as thin organic films, dirt, and native oxide from the surface of the substrate, and may include a hydrofluoric acid rinse, or a sputter etch in the reaction chamber 102 (FIG. 1). At 206 a first precursor material enters the reaction chamber for a predetermined length of time, for example 0.5-2.0 seconds. The first precursor material is chemically adsorbed onto the surface of the substrate, the amount depending upon the temperature of the substrate, in one embodiment 250° C., and the presence of sufficient flow of the precursor material. In addition, the pulsing of the precursor may use a pulsing period that provides uniform coverage of a chemisorbed monolayer on the substrate surface, or may use a pulsing period that provides partial formation of a monolayer on the substrate surface.

At 208 a first purge gas enters the reaction chamber for a predetermined length of time sufficient to remove substantially all of the non-chemisorbed first precursor material. Typical times may be 1.0-2.0 seconds with a purge gas comprising nitrogen, argon, neon, combinations thereof, or other gases such as hydrogen. At 210 a first reactant gas enters the chamber for a predetermined length of time, sufficient to provide enough of the reactant to chemically combine with the amount of chemisorbed first precursor material on the surface of the substrate. Typical reactant materials include mildly oxidizing materials, including, but not limited to, water vapor, hydrogen peroxide, nitrogen oxides, ammonia, ozone and oxygen gas, and combinations thereof. At 212 a second purge gas, which may be the same or different from the first purge gas, enters the chamber for a predetermined length of time, sufficient to remove substantially all non-reacted materials and any reaction byproducts from the chamber.

At 214 a decision is made as to whether or not the thickness of the first dielectric material in the dielectric has reached the desired thickness, or whether another deposition cycle is required. If another deposition cycle is needed, then the operation returns to 206, until the desired first dielectric layer is completed, at which time the process moves on to the deposition of the second material at 215. At 215 a second precursor material enters the reaction chamber for a predetermined length of time, typically 0.5-2.0 seconds. The second precursor material is chemically adsorbed onto the surface of the substrate, which in this case is the top surface of the first dielectric material, the amount of precursor absorbed depending upon the temperature of the substrate, and the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface.

At 216 the first purge gas is shown as entering the chamber, but the invention is not so limited. The purge gas used in the second dielectric material deposition may be the same or different from either of the two previously noted purge gases, and FIG. 1 could be shown as having more than the two purge gases shown. The purge cycle continues for a predetermined length of time sufficient to remove substantially all of the non-chemisorbed second precursor material.

At 218 a second reactant gas, which may the same or different from the first reactant gas, enters the chamber for a predetermined length of time, sufficient to provide enough of the reactant to chemically combine with the amount of chemisorbed second precursor material on the surface of the substrate. At 220 another purge gas enters the chamber, which may be the same or different from any of the three previously discussed purge gases, for a predetermined length of time, sufficient to remove substantially all non-reacted materials and any reaction byproducts from the chamber.

At 222 a decision is made as to whether or not the thickness of the second dielectric material in the nanolaminate dielectric has reached the desired thickness, or whether another deposition cycle is required. If another deposition cycle is needed, then the operation returns to 215, until the desired second dielectric layer is completed. The desired thicknesses of the first and second dielectric materials in the dielectric may not be the same thickness, and there may be more deposition cycles for one dielectric material as compared to the other. If the second dielectric layer has reached the desired thickness, the process moves on to a decision at 224 as to whether the number of layers of the first and second dielectric materials has reached the desired number. In this illustrative embodiment, a single layer of the first dielectric having a desired thickness, and a single layer of the second dielectric having a desired thickness, have been completed at this point in the process. If more than a single layer of each dielectric material is desired, the process moves back to another deposition of the first dielectric material at 206. After the number of interleaved layers of dielectrics one and two has reached the desired value, the deposition ends at 226. Because the dielectric values of the ALD oxides in the described embodiment are high, for example hafnium oxide may have a dielectric constant of 17 and hafnium nitride may have a dielectric constant of 30, and because the highly controlled layer thickness may be a single monolayer for each one of the interleaved dielectric layers, the physical thickness needed to obtain the equivalent dielectric properties of a very thin silicon dioxide layer may have from two to ten layers of each of the two described dielectric materials.

The embodiments described herein provide a process for growing a dielectric film having a wide range of useful equivalent oxide thicknesses, $t_{eq}$, associated with a dielectric constant in the range from about 17 to about 30. For an acceptable equivalent silicon dioxide thickness, an embodiment for a hafnium nitride and hafnium oxide may have a physical thickness that is more than four times larger than the equivalent silicon dioxide thickness, providing enhanced probability for reducing leakage current, especially due to tunneling mechanisms. Additionally, the novel process can be implemented to form transistors, capacitors, memory devices, and other electronic systems including information handling devices. The present subject matter is not limited to two dielectric materials, and the equipment described in FIG. 1 could have included a precursor and reactant 3, 4, which are not described for simplicity.

Figure 3:
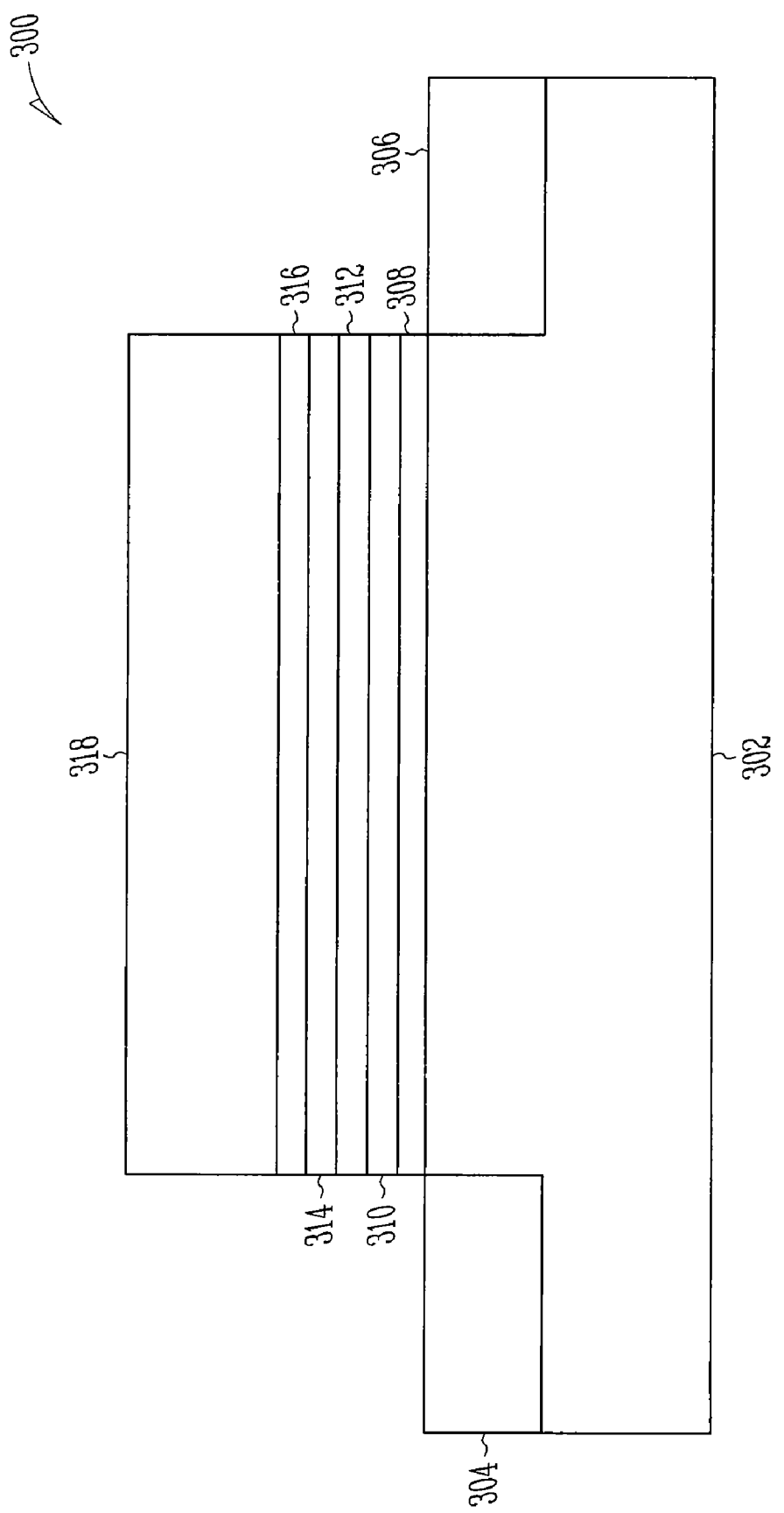
FIG. 3 illustrates an embodiment of a configuration of a transistor having a dielectric layer containing an atomic layer deposited dielectric layer containing hafnium nitride and hafnium oxide.

FIG. 3 illustrates a single transistor in an embodiment of a method to form a dielectric layer containing an ALD deposited hafnium nitride and hafnium oxide dielectric layer. This embodiment may be implemented with the system 100 of FIG. 1 used as an atomic layer deposition system. A substrate 302 is prepared, typically a silicon or silicon-containing material. In other embodiments, germanium, gallium arsenide, silicon-on-sapphire substrates, or other suitable substrates may also be used. The preparation process includes cleaning substrate 302 and forming various layers and regions of the substrate, such as drain diffusion 304 and source diffusion 306 of an illustrative metal oxide semiconductor (MOS) transistor 300, prior to forming a gate dielectric. In an embodiment, the substrate is cleaned to provide an initial substrate depleted of its native oxide. In an embodiment, the initial substrate is cleaned to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer. Cleaning immediately preceding atomic layer deposition aids in reducing an occurrence of silicon oxide at an interface between silicon based substrate and dielectric formed using the atomic layer deposition process. The sequencing of the formation of the regions of the transistor being processed may follow the generally understood fabrication of a MOS transistor as is well known to those skilled in the art.

The dielectric covering the area on the substrate 302 between the source and drain diffused regions 304 and 306 may be deposited by ALD in this illustrative embodiment, and may comprise one or more hafnium oxide layers 310 and 314, each potentially formed of many individual hafnium oxide layers, in an illustrative example, nine layers. There are also shown interleaved hafnium nitride layers 308, 312 and 316. Alternatively, there may be other combinations of interleaved and non-interleaved layers of varying thickness and deposition method. This nanolaminate dielectric layer is referred to as the gate oxide, and while shown as distinct and individual layers for clarity, may also be a single alloyed layer. There may be a diffusion barrier layer inserted between the first dielectric layer 308 and the substrate 302 to prevent metal contamination from affecting the electrical properties of the device. The illustrative embodiment shows the hafnium oxide layers 310 and 314 having the same thickness; however, the desired dielectric properties of the overall dielectric film may be best achieved by adjusting the ratio of the thickness of the two dielectric layers to different values. The lowest dielectric in this illustrative example is a hafnium nitride layer, but the embodiments are not so limited, and hafnium oxide may be made the lowest layer. The transistor 300 has a conductive material forming a gate 318 in this illustrative embodiment, but the dielectric may also be used in a floating gate device such as an EEPROM transistor, as either one or both of the floating gate and the control gate oxide layers. The conductive material may be polysilicon or various metals.

In an illustrative embodiment, the gate dielectric (layers 308-316) includes a tunnel gate insulator and a floating gate dielectric in a flash memory device. Use of dielectric layers containing an atomic layer deposited dielectric layer for a gate dielectric and/or floating gate dielectric in which the dielectric layer contacts a conductive layer is not limited to silicon based substrates, but may be used with a variety of semiconductor substrates.

Figure 4:
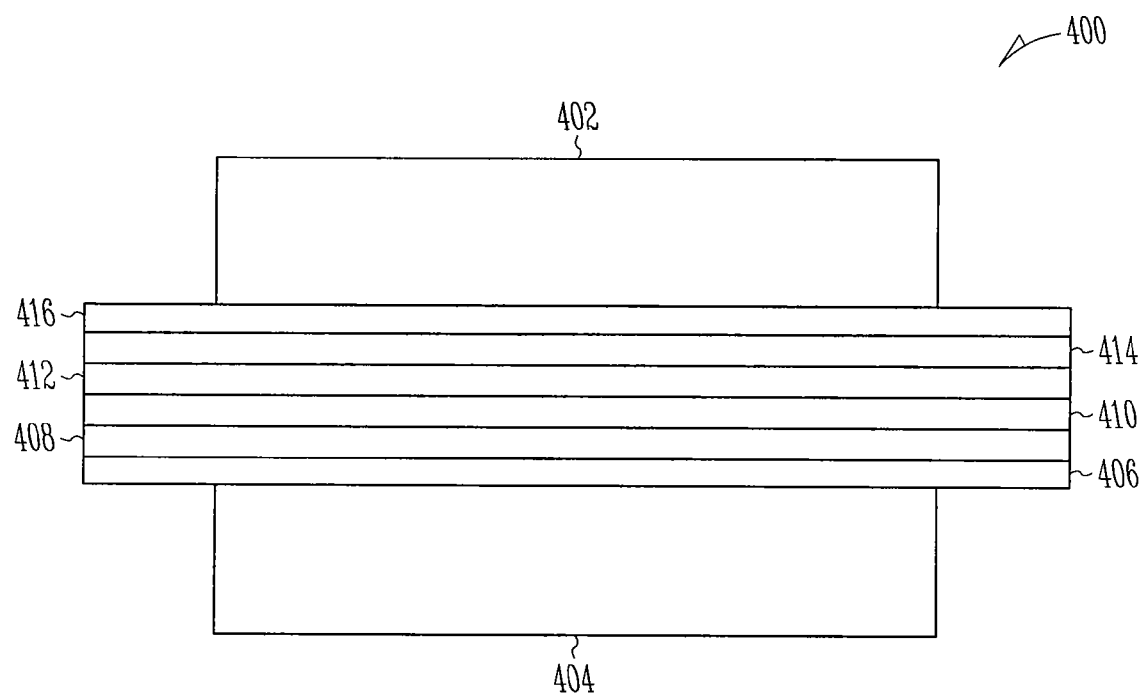
FIG. 4 shows an embodiment of a configuration of a capacitor having a dielectric layer containing atomic layer deposited hafnium nitride and hafnium oxide.

The embodiments of methods for forming dielectric layers containing an ALD deposited dielectric layer contacting a conductive layer may also be applied to forming capacitors in various integrated circuits, memory devices, and electronic systems. In an embodiment including a capacitor 400 illustrated in FIG. 4, a method includes forming a first conductive layer 402, a second conductive layer 404, and having a dielectric having interleaved layers 406-416 of two or more different dielectric materials, such as hafnium oxide and hafnium nitride, formed between the two conductive layers. The conductive layers 402 and 404 may include metals, doped polysilicon, silicided metals, polycides, or conductive organic compounds, without affecting the teachings of this embodiment. The sequencing and thickness of the individual dielectric layers 406-416 depends on the application and may include a single layer of each material, one layer of one of the materials and multiple layers of the other, or other combinations of layers including different layer thicknesses. By selecting each thickness and the composition of each layer, a nanolaminate structure can be engineered to have a predetermined dielectric constant and composition. In an embodiment, the total thickness of layers 408, 412 and 416 is equal to the thickness of layers 406, 410 and 414, providing a 50% combination of a first material (for example hafnium nitride) and a second material (for example hafnium oxide) and resulting in a dielectric layer having a dielectric constant k about halfway between the dielectric constant 17 of hafnium oxide and the dielectric constant 30 of hafnium nitride. Although the dielectric layers are shown in this illustrative example as being distinct layers, the oxide may be alloyed together to form a single material layer. Structures such as the nanolaminate structure shown in FIGS. 3 and 4 may be used in NROM flash memory devices as well as other integrated circuits. Transistors, capacitors, and other devices having dielectric films may be implemented into memory devices and electronic systems including information handling devices. Embodiments of these information handling devices include wireless systems, telecommunication systems, computers and integrated circuits.

Figure 5:
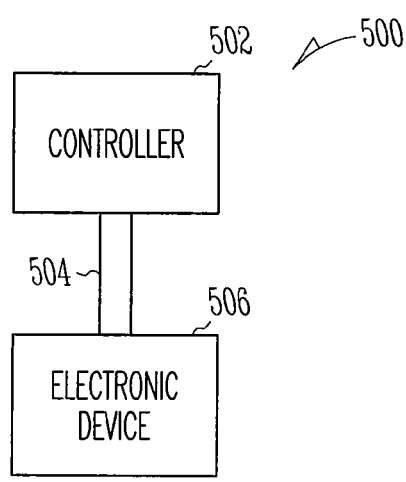
FIG. 5 is a simplified diagram of an embodiment of a controller coupled to an electronic device containing an atomic layer deposited nanolaminate layered sequence of hafnium nitride and hafnium oxide.

FIG. 5 illustrates a diagram for an electronic system 500 having one or more devices having a dielectric layer containing an atomic layer deposited oxide layer formed according to various embodiments. Electronic system 500 includes a controller 502, a bus 504, and an electronic device 506, where bus 504 provides electrical conductivity between controller 502 and electronic device 506. In various embodiments, controller 502 and/or electronic device 506 includes an embodiment for a dielectric layer containing an ALD deposited dielectric layer as previously discussed herein. Electronic system 500 may include, but is not limited to, information handling devices, wireless systems, telecommunication systems, fiber optic systems, electro-optic systems, and computers.

Figure 6:
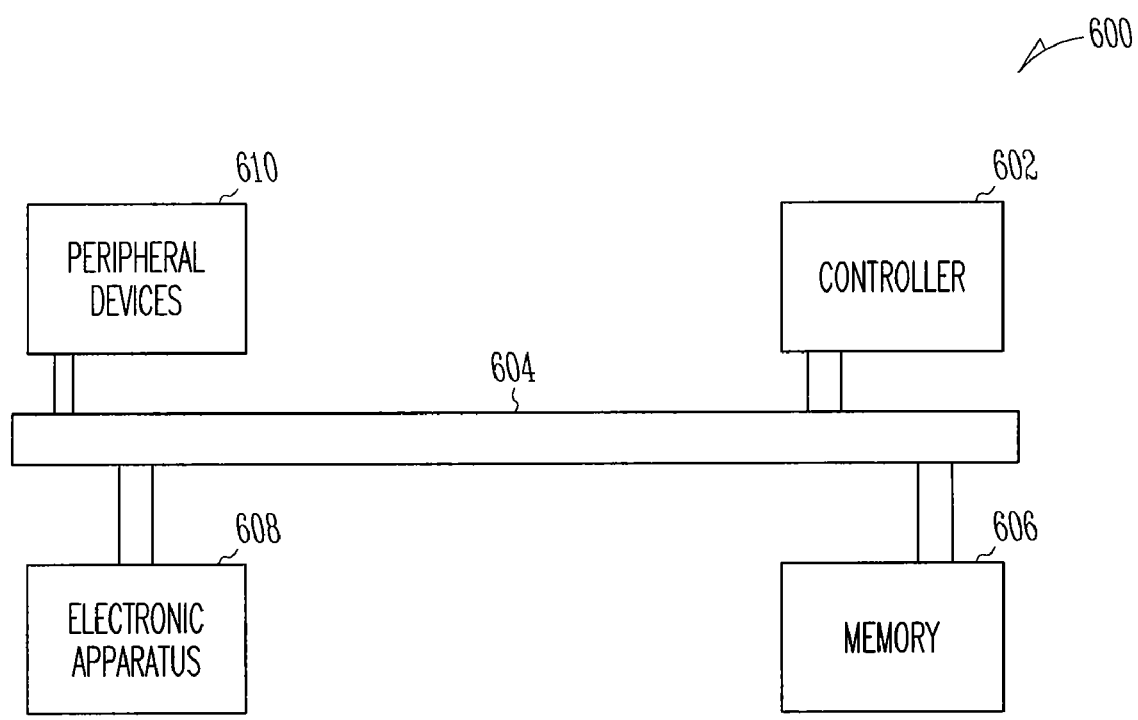
FIG. 6 illustrates a diagram of an embodiment of an electronic system having devices with a dielectric film containing an atomic layer deposited nanolaminate dielectric layer having a layered sequence of hafnium nitride and hafnium oxide.

FIG. 6 depicts a diagram of an embodiment of a system 600 having a controller 602 and a memory 606. Controller 602 and/or memory 606 includes a dielectric layer having an ALD dielectric layer. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a dielectric layer having an ALD deposited oxide layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as and other emerging DRAM technologies.

Formation of hafnium oxide layers by ALD deposition may be realized using a homoleptic tetrakisdialkylamine metal(IV) precursor chemical, and an oxidizing reactant, such as water vapor. Hafnium nitride layers by ALD deposition may be realized by using a homoleptic tetrakisdialkylamine metal (IV) precursor chemical, and a reactant such as ammonia. Further, such dielectric films may be formed by ALD reactions processed at relatively low temperatures, such as 250° C., may be amorphous and possess smooth surfaces. Such ALD dielectric films may provide enhanced electrical properties as compared to physical deposition methods, such as sputtering or typical chemical layer depositions, due to their smoother surface, and reduced damage, resulting in reduced leakage current. Additionally, such dielectric layers provide a significantly thicker physical thickness than a silicon oxide layer having the same electrical equivalent oxide thickness, where the increased thickness may also reduce leakage current issues. These properties of ALD deposited dielectric layers allow for application as dielectric layers in electronic devices and systems.

Dielectric layers formed from hafnium nitride and hafnium oxide have beneficial properties for gate dielectrics and capacitor dielectric materials including thermal stability, high dielectric constant and low leakage currents. The conductive layers contacting the dielectric may include metals, semiconductor materials, polycrystalline semiconductor materials and doped materials of either conductivity type.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited hafnium oxide are formed having a dielectric constant (k) substantially higher than that of silicon oxide, such that these dielectric films possess an equivalent thickness, $t_{eq}$, thinner than $SiO_2$ gate dielectrics of the same physical thickness. Alternatively, the high dielectric constant relative to silicon dioxide allows the use of much larger physical thickness of these high-k dielectric materials for the same $t_{eq}$ of $SiO_2$. Films having the relatively larger physical thickness aids in processing gate dielectrics and other dielectric layers in electronic devices and systems, and improves the electrical properties of the dielectrics.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the embodiments of the present invention should be determined with reference to the appended claims, along with the full scope of equivalents to which such claims are entitled.

What is claimed is:

1. An electronic device comprising:
an amorphous dielectric layer containing a first plurality of hafnium nitride layers interleaved with a second plurality of hafnium oxide layers in an integrated circuit; and
a conductive layer contacting the amorphous dielectric layer.

2. The electronic device of claim 1, wherein the electronic device includes a memory having the amorphous dielectric layer as a gate insulator in a transistor device.

3. The electronic device of claim 2, wherein the gate insulator in the memory device is an inter-gate insulator in a flash memory device.

4. The electronic device of claim 1, wherein the electronic device includes a transistor in the integrated circuit, the transistor having the amorphous dielectric layer as a gate insulator and the conductive layer as a gate in the transistor.

5. The electronic device of claim 1, wherein the electronic device includes a CMOS transistor in the integrated circuit, the CMOS transistor having the amorphous dielectric layer as a gate insulator and the conductive layer as a gate.

6. The electronic device of claim 1, wherein the electronic device includes a capacitor having the amorphous dielectric layer as a dielectric material between two electrodes in the capacitor, and the conductive layer as at least one of the two electrodes.

7. The electronic device of claim 1, further comprising:
a controller coupled to the integrated circuit.

8. The electronic device of claim 7, wherein the electronic device includes a memory.

9. The electronic device of claim 1, further comprising at least one NROM device.

10. The electronic device of claim 1, further comprising a semiconductive substrate having a first dielectric layer, a first conductive layer disposed over the first dielectric layer, a second dielectric layer disposed on the first conductive layer, and a second conductive layer disposed on the second dielectric layer and over the first conductive layer, wherein at least one of the first dielectric layer or the second dielectric layer comprises the first plurality of hafnium nitride layers interleaved with the second plurality of hafnium oxide layers, the hafnium nitride layers and the hafnium oxide layers structured as atomic layer deposited layers.

11. The electronic device of claim 1, further comprising at least one flash memory device.

12. An electronic device comprising:
an dielectric layer comprising a first plurality of hafnium nitride layers having a first thickness interleaved with a second plurality of hafnium oxide layers having a second thickness; and
a conductive layer contacting the dielectric layer.

13. The electronic device of claim 12, wherein the dielectric layer consists essentially of a nanolaminate of the hafnium nitride layers and the hafnium oxide layers.

14. The electronic device of claim 12, further comprising the first plurality of hafnium nitride layers having a graded composition smoothly changing into the second plurality of hafnium oxide layers.

15. The electronic device of claim 12, further comprising the first plurality of hafnium nitride layers including a composition with an approximate formula of $Hf_3N_4$, and the second plurality of hafnium oxide layers including an approximate formula of $HfO_2$.

16. The electronic device of claim 15, further comprising the hafnium oxide layers having a vertical thickness from 1.3 to 1.5 Angstroms.

17. The electronic device of claim 15, wherein the hafnium oxide layers have a root mean square surface roughness that is less than one tenth of the layer thickness.

18. The electronic device of claim 15, further comprising an interface between each individual one of the first plurality of hafnium nitride layers and the second plurality of hafnium oxide layers that is less than 1.0 Angstroms thick.

19. The electronic device of claim 15, wherein a ratio of a thickness of the hafnium oxide layers to a thickness of the hafnium nitride layers is selected to result in a dielectric constant of the dielectric film of greater than 20.

20. The electronic device of claim 15, wherein the dielectric layer is separated from a semiconductive substrate by a diffusion barrier.

21. A method comprising:
forming an integrated circuit having a dielectric layer, the dielectric layer having a nanolaminate containing a first plurality of hafnium nitride layers interleaved with a second plurality of hafnium oxide layers, each hafnium oxide layer and each hafnium nitride layer formed by atomic layer deposition; and
forming a conductive layer on the dielectric layer.

22. The method of claim 21, wherein the atomic layer deposition of the hafnium nitride includes a precursor comprising homoleptic(tetrakisdialkyloamido)metal(IV) complexes of hafnium and ammonia at a temperature of between 150° C. to 250° C.

23. The method of claim 22, wherein the homoleptic (tetrakisdialkyloamido) metal(IV) complex of hafnium comprises at least one of $Hf[(CH_3)_2]_4$, $Hf[(C_2H_5)_2]_4$, or $Hf[(CH_3)(C_2H_5)]_4$.

24. The method of claim 21, wherein the atomic layer deposition of the hafnium oxide includes a precursor comprising homoleptic (tetrakisdialkyloamido)metal(IV) complexes of hafnium and water vapor at a temperature of between 200° C. to 300° C.

25. The method of claim 24, wherein the homoleptic (tetrakisdialkyloamido) metal(IV) complex of hafnium comprises $Hf[(CH_3)(C_2H_5)]_4$.

\* \* \* \* \*